United States Patent [19]

Okabe

[11] 4,274,059
[45] Jun. 16, 1981

[54] SINGLE ENDED PUSH-PULL AMPLIFIER

[75] Inventor: Yasuhisa Okabe, Yokohama, Japan

[73] Assignee: Victor Company of Japan, Limited, Yokohama, Japan

[21] Appl. No.: 963,901

[22] Filed: Nov. 27, 1978

[30] Foreign Application Priority Data

Dec. 1, 1977 [JP] Japan ............................... 52/144257

[51] Int. Cl.$^3$ ............................................. H03F 3/30
[52] U.S. Cl. ..................................... 330/266; 330/268
[58] Field of Search ............... 330/266, 267, 268, 272, 330/273, 274

[56] References Cited

U.S. PATENT DOCUMENTS 3,995,228  11/1976  Pass .................................. 330/268 X Primary Examiner—James B. Mullins
Attorney, Agent, or Firm—Lowe, King, Price & Becker

[57] ABSTRACT

Two closed loops including a base bias controlling circuit are provided in a single ended push-pull amplifier. The base bias controlling circuit controls base bias voltages of respective transistors constituting the final stage of the push-pull operation so that a predetermined small amount of collector current flows via each of the collector-emitter paths of the transistors irrespective of the presence and absence of the input signal. Because of the predetermined collector currents, none of the transistors is held at cutoff in operation, thereby preventing the occurrence of the crossover distortion.

8 Claims, 7 Drawing Figures

SINGLE ENDED PUSH-PULL AMPLIFIER

FIELD OF THE INVENTION

This invention generally relates to a transistor amplifier. More specifically, the present invention relates to a single ended push-pull amplifier.

BACKGROUND OF THE INVENTION

In a conventional Class B push-pull amplifier the output signal (the amplified signal) includes distortion components due to the highly curved arcuate portion in the $V_{BE}$ (voltage across the base and emitter of the output transistor) to $I_C$ (collector current of the transistor) characteristics. This distortion appears around the boundry between the positive and negative waves respectively amplified by first and second transistors which constitute the final stage of a push-pull arrangement, and is usually called crossover distortion. To prevent the occurrence of such distortion in operation of a push-pull amplifier, push-pull amplifiers are usually used in Class AB operation. In such a Class AB push-pull amplifier, a suitable amount of a bias voltage is applied to each of the transistors so as to shift the operating point of the transistors. However, it is impossible to perfectly eliminate the crossover distortion from the output signal of such a Class AB push-pull amplifier since the curve of the arcuate portion in the $V_{BE}$ to $I_C$ characteristics is not of the second order. Further, when such a Class AB push-pull amplifier is used as a SEPP (single ended push-pull) circuit, the crossover distortion becomes remarkably large due to the existence of a base bias stabilizing circuit which has a constant voltage characteristic. These drawbacks of the conventional push-pull circuit will be further discussed in detail with reference to the accompanying drawings.

SUMMARY OF THE INVENTION

The present invention has been developed in order to remove the above-mentioned drawbacks of the conventional push-pull amplifiers. Briefly speaking, in the present invention, at least a predetermined small amount of collector current always flows via each of the collector-emitter paths of first and second transistors constituting the final stage of the push-pull amplifier so that none of the transistors is held at cutoff, thereby preventing the occurrence of crossover distotion. In other words, the base biases are so controlled that the above-mentioned predetermined collector current flows through each of the transistors.

According to the present invention there is provided a single ended push-pull amplifier comprising: (a) a single ended push-pull final stage having first and second transistor-ampliying stages for respectively amplifying each half cycle of an input signal, which is preamplified in Class A operation, (b) first and second resistors respectively interposed in the collector-emitter paths of the first and second transistor-amplifying stages; (c) a base bias controlling circuit for controlling base bias voltages of the first and second transistor-amplifying stages; and (c) means for controlling the base bias controlling circuit. The means for controlling the base bias controlling circuit includes third and fourth resistors respectively forming first and second closed loops respectively responsive to the input signal and connected to a load of the input signal. The first closed loop includes the first resistor, the base circuit of the first transistor-amplifying stage, a portion of the base bias controlling circuit and the third resistor. The second closed loop includes the second resistor, the base circuit of the second transistor-amplifying stage, a portion of the base bias controlling circuit and the fourth resistor.

Although the single ended push-pull amplifier according to the present invention is not strictly classified as such as Class A, Class AB or Class B, it will be apparent from the following detailed description that the single ended push-pull amplifier according to the present invention may be classified as a Class B amplifier in view of the fact that positive and negative half cycles of an input signal are respectively amplified by two transistors of the final stage, while the same single ended push-pull amplifier may be classified as a Class AB amplifier in view of the operating point or range of the transistors.

It is therefore an object of the present invention to provide a single ended push-pull amplifier in which crossover distortion is remarkably reduced.

Another object of the present invention is to provide such an amplifier in which switching distortion is considerably reduced.

A further object of the present invention is to provide such an amplifier in which efficiency of the amplifying operation is high.

BRIEF DESCRIPTION OF THE DRAWINGS

These and other objects and features of the present invention will become more readily apparent from the following detailed description of the preferred embodiments taken in conjunction with the accompanying drawings in which.

DETAILED DESCRIPTION OF THE DRAWINGS

Prior to the description of the preferred embodiments of the push-pull amplifier according to the present invention, a conventional push-pull amplifier will be described hereinafter.

Figure 1:
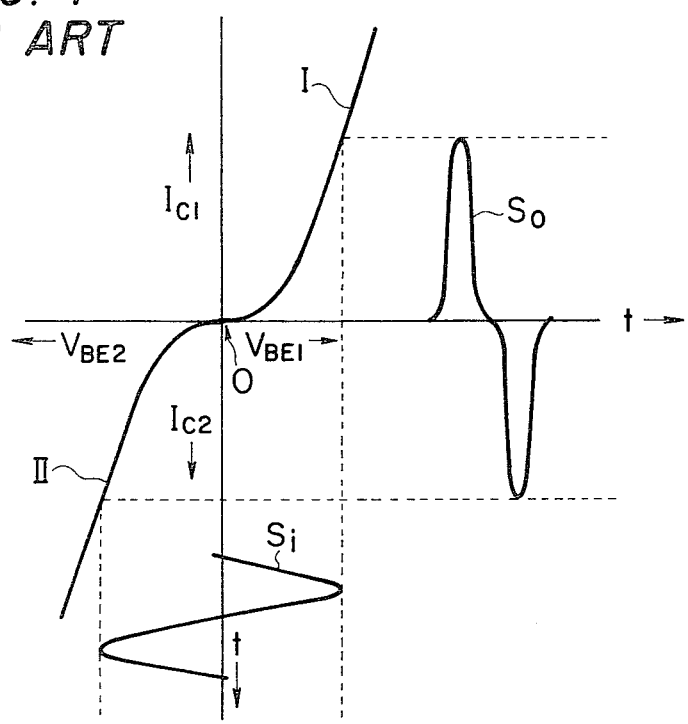
FIG. 1 is a diagram of the input-output characteristics of the conventional push-pull amplifier.

Reference is now made to FIG. 1, a graphical diagram of the input-output characteristics of a conventional Class B push-pull amplifier which includes a pair of output transistors. A first characteristic curve of the first transistor is denoted by a reference I, while a second characteristic curve of the other transistor is denoted by a reference II. The abscissa indicates $V_{BE1}$ (a voltage across the base and emitter of the first transistor) and $V_{BE2}$ (a voltage across the base and emitter of the second transistor), while the ordinate indicates the $I_{C1}$ (the collector current of the first transistor) and $I_{C2}$ (the collector current of the second transistor). The waveform of the input signal is denoted by a reference $S_i$, while the waveform of the output signal is denoted by a reference $S_o$. A reference O indicates the origin of the push-pull operation. As shown by the waveform of the output signal $S_O$, distortion appears around the boundary portions between the positive and negative waves. This distortion is called a crossover distortion.

To eliminate the crossover distortion, a Class AB push-pull amplifier is conventionally used. In Class AB operation of a push-pull amplifier, suitable bias voltages are applied to the pair of transistors so as to shift the origin of the push-pull operation toward a relatively linear portion of the characteristic curve of the $V_{BE}$ to $I_C$ characteristics. The bias voltages are respectively applied to the first and second transistors so that the first and second transistors operate on a substantially linear composite operating curve which is equivalently formed by means of the differential operation at highly curved arcuate portions along the $V_{BE}$ to $I_C$ characteristic curves. However, as well known, the highly curved portions along the $V_{BE}$ to $I_C$ characteristic curves are not of the second order and therefore, the composite operating curve is not a perfect straight line. Consequently, it is impossible to eliminate the crossover distortion from the output signal of the Class AB push-pull amplifier.

Further, when such a Class AB push-pull amplifier is constructed so as to function as a single ended push-pull (SEPP) amplifier, the crossover distortion due to the above-mentioned reasons is remarkably large because of the existance of a base bias stabilizing circuit which has a constant voltage characteristic. This point will be described in detail in connection with FIG. 2 hereinbelow.

Figure 2:
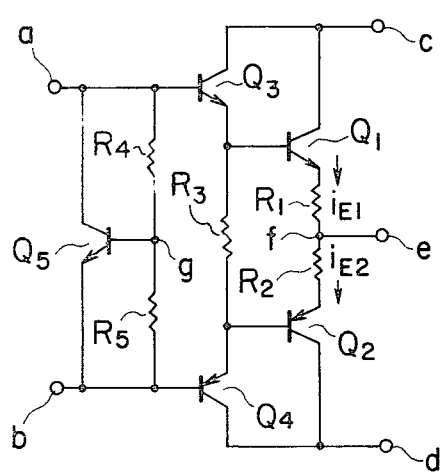
FIG. 2 is a circuit diagram of a conventional push-pull amplifier.

Hence, reference is now made to FIG. 2, a circuit diagram of a conventional single ended push-pull amplifier used in Class AB operation. Transistors $Q_1$ and $Q_3$ are arranged in a compound connection, more particularly, in a Darlington connection, while transistors $Q_2$ and $Q_4$ are connected in the same manner as the transistors $Q_1$ and $Q_3$. The combination of the first and third transistors $Q_1$ and $Q_3$ and the other combination of the second and fourth transistors $Q_2$ and $Q_4$ function as a pair of transistors in the Class AB single ended push-pull circuit.

The collectors of the first and third transistors $Q_1$ and $Q_3$ are connected to a terminal "c" to which a positive power supply (not shown) is connected, while the collectors of the second and fourth transistors $Q_2$ and $Q_4$ are connected to a terminal "d" to which a negative power supply (not shown) is connected. A series circuit of first and second resistors $R_1$ and $R_2$ is interposed between the emitters of the first and second transistors $Q_1$ and $Q_2$. The first and second transistors $R_1$ and $R_2$ are used for limiting the emitter currents of the first and second transistors $Q_1$ and $Q_2$, while a junction "f" connecting the first and second resistors $R_1$ and $R_2$ is connected to an output terminal "e" to which a suitable speaker may be connected. A third resistor $R_3$ is interposed between the emitters of the third and fourth transistors $Q_3$ and $Q_4$, while the emitters of the same are respectively connected to the bases of the first and second transistors $Q_1$ and $Q_2$ to complete Darlington connections.

The base of the third transistor $Q_3$ is connected to an input terminal "a" via which an input (driving) signal flows in, while the base of the fourth transistor $Q_4$ is connected to the other input terminal "b" via which the input (driving) signal flows out. A fifth transistor $Q_5$ is interposed between the bases of the third and fourth transistors $Q_3$ and $Q_4$ in a manner that the collector and the emitter of the fifth transistor $Q_5$ are respectively connected to the bases of the third and fourth transistors $Q_3$ and $Q_4$. A series circuit of fourth and fifth resistors $R_4$ and $R_5$ is interposed between the bases of the third and fourth transistors $Q_3$ and $Q_4$, while a junction "g" connecting the fourth and fifth resistors $R_4$ and $R_5$ is connected to the base of the fifth transistor $Q_5$. The fifth transistor $Q_5$ is employed for stabilizing the base bias voltages of the third and fourth transistors $Q_3$ and $Q_4$, while the fourth and fifth resistors $R_4$ and $R_5$ are used for producing the base bias voltage of the transistor $Q_5$. In other words, the fourth and fifth resistors $R_4$ and $R_5$ as well as the fifth transistors $Q_5$ constitute a base bias stabilizing circuit. As well known, the circuit shown in FIG. 2 functions as a Class AB amplifier when suitable bias voltages are respectively fed to the bases of the third and fourth transistors $Q_3$ and $Q_4$ so as to amplify the input signal applied across the terminals "a" and "b", to obtain an output signal at the output terminal "e".

In the circuit shown in FIG. 2, the following relationship is given under an assumption that the first and third transistors $Q_1$ and $Q_3$ are active, while the second and fourth transistors $Q_2$ and $Q_4$ are not active, i.e. being held at cutoff.

$$V_{BE2} + V_{BE4} = V_{CE5} - (V_{BE1} + V_{BE3} + i_{E1} \cdot r_1)$$

wherein
$V_{BE1}$ is a voltage across the base and emitter of the first transistor $Q_1$;
$V_{BE2}$ is a voltage across the base and emitter of the second transistor $Q_2$;
$V_{BE3}$ is a voltage across the base and emitter of the third transistor $Q_3$;
$V_{BE4}$ is a voltage across the base and emitter of the fourth transistor $Q_4$;
$i_{E1}$ is a current via the emitter of the first transistor $Q_1$;
$V_{CE5}$ is a voltage across the collector and emitter of the fifth transistor $Q_5$; and
$r_1$ is the resistance of the resistor $R_1$.

It is to be noted that the bias stabilizing circuit is a constant voltage circuit and therefore, the voltage $V_{CE5}$ is maintained constant. It is apparent that the values of $V_{BE1}$, $V_{BE3}$ and the voltage drop across the first resistor $R_1$, which is expressed in terms of ($i_{E1} \cdot r_1$), when the first and third transistors $Q_1$ and $Q_3$ are active and amplifying an input signal, are higher than in the case when the transistors $Q_1$, $Q_3$ are not fed with an input signal. Consequently, the sum of the values of $V_{BE2}$ and $V_{BE4}$, when the first and third transistors $Q_1$ and $Q_3$ is active, are higher than in the case when the transistors $Q_1$ and $Q_3$ are not fed with an input signal.

Therefore, when the magnitude of the input signal increases from zero in a direction that the first and third transistors $Q_1$ and $Q_3$ tend to be active, the second and fourth transistors $Q_2$ and $Q_4$ are driven to collector current cutoff. On the contrary, when the magnitude of the input signal increases in the opposite direction from zero, the first and third transistors $Q_1$ and $Q_3$ are driven to collector current cutoff.

As described above, since the first group of the transistors including the first and third transistors $Q_1$ and $Q_3$ and the second group of the transistors including the second and fourth transistors $Q_2$ and $Q_4$ alternatively become active, while the other group of transistors is held at cutoff, the linearity of the composite operating curve formed by the differential operation of the pair of the groups of the transistors, is quite poor and thus crossover distortion is produced in the output signal.

Further, since the transistors in such a push-pull circuit repeat the ON (active) and OFF (cutoff) operations when functioning as an amplifier, a high frequency input signal is likely to cause so-called switching distortion in the output signal due to minority carrier storage effect.

Figure 3:
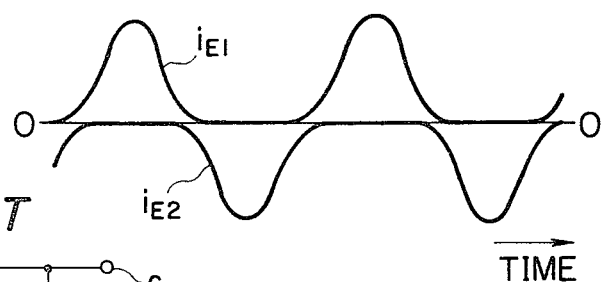
FIG. 3 is a waveform of an output signal obtained by the conventional push-pull amplifier shown in FIG. 2.

FIG. 3 is an illustration of the waveforms of emitter currents $i_{E1}$ and $i_{E2}$ of the first and second transistors $Q_1$ and $Q_2$ shown in FIG. 2, the emitter currents flowing toward the output terminal "e" in response to a sine wave input signal. As seen from FIG. 3, the output signal obtained at the output terminal "e" includes large crossover distortion.

The present invention provides an improved single ended push-pull amplifier in which the above described undesirable distortion is effectively eliminated. Detailed descriptions of the preferred embodiments of the present invention will be made hereinafter.

Figure 4:
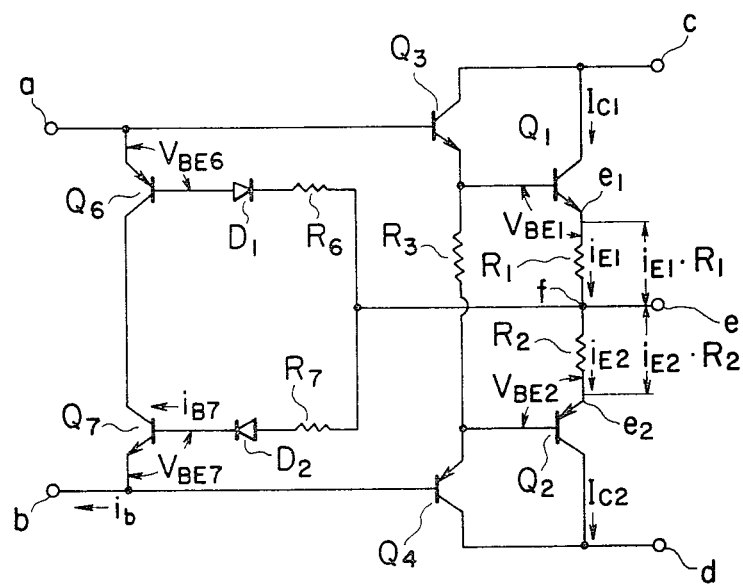
FIG. 4 is a circuit diagram of the first preferred embodiment of the single ended push-pull amplifier according to the present invention.

Reference is now made to FIG. 4, a circuit diagram of a single ended push-pull amplifier according to the present invention. The elements which correspond to those in FIG. 2 are denoted by the same reference numerals. First and second transistors $Q_1$ and $Q_3$ are in a compound connection, more particularly, in a Darlington connection, while second and fourth transistors $Q_2$ and $Q_4$ are connected in the same manner as the first and third transistors $Q_1$ and $Q_3$. The combination of the first and third transistors $Q_1$ and $Q_3$ and the other combination of the second and fourth transistors $Q_2$ and $Q_4$ function as a pair of transistors of the final stage of a single ended push-pull circuit.

The collectors of the first and third transistors $Q_1$ and $Q_3$ are connected to a terminal "c" to which a positive power supply (not shown) is connected, while the collectors of the second and fourth transistors $Q_2$ and $Q_4$ are connected to a terminal "d" to which a negative power supply (not shown) is connected. A series circuit of first and second resistors $R_1$ and $R_2$ is interposed between the emitters $e_1$ and $e_2$ of the first and second transistors $Q_1$ and $Q_2$. The first and second resistors $R_1$ and $R_2$ are used for limiting the emitter currents of the first and second transistors $Q_1$ and $Q_2$, while a junction "f" connecting the first and second resistors $R_1$ and $R_2$ is connected to an output terminal "e". A third resistor $R_3$ is interposed between the emitters of the third and fourth transistors $Q_3$ and $Q_4$, while the emitters of the same are respectively connected to the bases of the first and second transistors $Q_1$ and $Q_2$ to complete Darlington connections.

The base of the third transistor $Q_3$ is connected to a driving signal flow-in terminal "a" via which an input (driving) signal flows in, while the base of the fourth transistor $Q_4$ is connected to a driving signal flow-out terminal "b" via which the input (driving) signal flows out. Two transistors $Q_6$ and $Q_7$ are interposed between the flow-in and flow-out terminals "a" and "b" in a manner that the emitter of the transistor $Q_6$ is connected to the terminal "a", while the emitter of the transistor $Q_7$ is connected to the other terminal "b". The collectors of the transistors $Q_6$ and $Q_7$ are connected directly to each other. The base of the transistor $Q_6$ is connected to an anode of a first diode $D_1$ the cathode of which is connected via a resistor $R_6$ to the output terminal "e", while the base of the transistor $Q_7$ is connected to a cathode of a second diode $D_2$ the anode of which is connected via a resistor $R_7$ to the same output terminal "e". The transistors $Q_6$ and $Q_7$ are employed for regulating the base bias voltages which are respectively applied to the third and fourth transistors $Q_3$ and $Q_4$. The first diode $D_1$ is utilized for compensating for the temperature drift of the first and third transistors $Q_1$ and $Q_3$, while the second diode $D_2$ is utilized for compensating for the temperature drift of the second and fourth transistors $Q_2$ and $Q_4$. Although in the above description, the polarity, i.e. either pnp type or npn type, of the transistors is not mentioned, it will be apparent from the symbols of the transistors shown in FIG. 4 that transistors $Q_1$, $Q_3$ and $Q_7$ are of npn type, while remaining transistors $Q_2$, $Q_4$ and $Q_6$ are of pnp type.

A suitable Class A amplifier (not shown) which may be of a conventional type, is connected to the driving signal flow-in terminal "a". With this arrangement, a predetermined amount of current flows into the terminal "a" even though the level of an input signal of the Class A amplifier is zero. Further, a suitable load of the input signal flowing into the terminal "a" is connected to the driving signal flow-out terminal "b". As the load, a resistor (not shown) may be interposed between the terminal "b" and the terminal "d". If desired, a suitable constant-current circuit or source may be connected to the terminal "b" so as to function as a load, where the operation of the push-pull amplifier becomes more stable.

In the above described single ended push-pull amplifier according to the present invention, the resistance values $r_6$ and $r_7$ of the resistors $R_6$ and $R_7$ are so selected that predetermined small value of electric currents respectively flow through the collector circuits and the emitter circuits of the first group of transistors $Q_1$ and $Q_3$ and the second group of transistors $Q_2$ and $Q_4$ under a condition of receiving no input signal.

Figure 5:
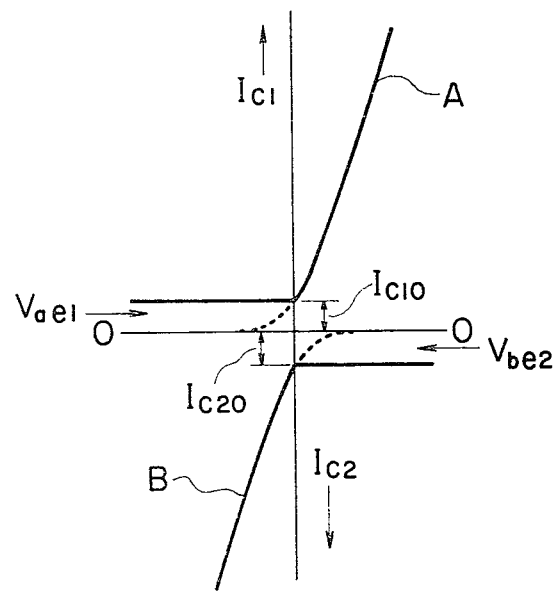
FIG. 5 is a diagram of the input-output characteristics of the amplifier shown in FIG. 4.

FIG. 5 is a diagram of the input-output characteristics of the amplifier shown in FIG. 4. A curve "A" indicates the relationship between the collector current $I_{C1}$ of the first transistor $Q_1$ and the voltage $V_{ae1}$ across the driving signal flow-in terminal "a" and the emitter $e_1$ of the first transistor $Q_1$, while the other curve "B" indicates the relationship between the collector current $I_{C2}$ of the second transistor $Q_2$ and the voltage $V_{be2}$ across the driving signal flow-out terminal "b" and the emitter $e_2$ of the second transistor $Q_2$. Both of the curves A and B are shown in FIG. 5 by solid lines, while dotted lines indicate original characteristics of the first and second transistors $Q_1$ and $Q_2$ when used without application of the aforementioned predetermined small values of collector currents. As shown in FIG. 5, each of the curves A and B consists of a constant portion and a varying (rising) portion. The value of the collector current $I_{C1}$ of the first transistor $Q_1$ along the constant portion is expressed in terms of $I_{C10}$, while the value of the other collector current $I_{C2}$ of the second transistor $Q_2$ along the other constant portion is expressed in terms of $I_{C20}$. These constant values of the respective collector currents $I_{C1}$ and $I_{C2}$ are given by respectively selecting the resistance values $r_6$ and $r_7$ of the resistors $R_6$ and $R_7$. It is to be noted that these constant collector currents flow respectively when no input signal is applied to respective first and second transistors $Q_1$ and $Q_2$. Each of the values of the collector currents $I_{C1}$ and $I_{C2}$ is so selected as to correspond with the values on the original curves of the $V_{BE}$ to $I_C$ relationship at a point close to a relatively straight portion of the curve, while the value of $I_{C10}$ equals the other value of $I_{C20}$.

With this provision, the predetermined amount of collector currents $I_{C10}$ and $I_{C20}$ flow via the collector-emitter paths of the first and second transistors $Q_1$ and $Q_2$ respectively. These predetermined amount of collector currents are referred to as idling currents hereinafter throughout the specification. It will be understood that the idling currents flow through the first and second transistors $Q_1$ and $Q_2$ which constitute the final stage of the single ended push-pull amplifier, by means of the base bias voltages respectively supplied to the third and fourth transistors $Q_3$ and $Q_4$. These bias voltages are controlled by a base bias control circuit which includes the transistors $Q_6$ and $Q_7$, the first and second diodes $D_1$ and $D_2$, and the resistors $R_6$ and $R_7$.

The function and the operation of the circuit shown in FIG. 4 are described infra. For the convenience of the explanation, it is assumed that the first and third transistors $Q_1$ and $Q_3$ are active in response to an input signal applied to the driving signal flow-in terminal "a". When an input signal waveform applied to the driving signal flow-in terminal "a" is such that the first and third transistors $Q_1$ and $Q_3$ become active, the voltage between the terminal "a" and the output terminal "e" becomes high, thereby increasing the base current of the transistor $Q_6$ included in the base bias controlling circuit. Therefore, the transistor $Q_6$ operates in or near the saturation region thereof, while the voltage between the driving signal flow-out terminal "b" and the output terminal "e" tends to be low. However, when the voltage across the terminals "b" and "e" tends to be lower and lower, the operating condition of the transistor $Q_7$ included in the base bias controlling circuit approaches the cutoff region, thereby decreasing the voltage at the driving signal flow-out terminal "b" with respect to the voltage at the output terminal "e". Since the decrease in voltage at the terminal "b" cuases base currents to flow through the second and fourth transistors $Q_2$ and $Q_4$ the second and fourth transistors $Q_2$ and $Q_4$ are not held at cutoff even though the first and third transistors $Q_1$ and $Q_3$ become active. This point will be described in connection with the following algebraic expressions.

The current $i_b$ flowing via the driving signal flow-out terminal "b" is given by:

$$i_b = (i_{B7} \times h_{fe7}) + (i_{E2}/h_{fe2} \times h_{fe4}) \quad (1)$$

wherein $i_{B7}$ is the base current of the transistor $Q_7$;
$i_{E2}$ is the emitter current of the second transistor $Q_2$;
$h_{fe2}$ is the current amplification factor of the second transistor $Q_2$;
$h_{fe4}$ is the current amplification factor of the fourth transistor $Q_4$; and
$h_{fe7}$ is the current amplification factor of the transistor $Q_7$.

Apart from the above equation, the following relationship is obtained since the voltages across the base and the emitter of each of transistors $Q_2$, $Q_4$ and $Q_7$ and the forward voltage drop across the second diode $D_2$ are substantially equal to each other.

$$i_{B7} \times r_7 = i_{E2} \times r_2 \quad (2)$$

wherein $r_2$ is the resistance of the resistor $R_2$; and
$r_7$ is the resistance of the resistor $R_7$.

From the above equations (1) and (2), the emitter current $i_{E2}$ of the second transistor $Q_2$ is expressed by the following equation.

$$i_{E2} = \frac{i_b}{\frac{r_2}{r_7} \times h_{fe7} + \frac{1}{h_{fe2} \times h_{fe4}}} \quad (3)$$

In the above eqaution (3), the factors of the resistances $r_2$, and $r_7$, and the current amplification factors $h_{fe2}$, $h_{fe4}$ and $h_{fe7}$ are determined by the elements used in the circuit. Since the value of the current $i_b$ does not become zero, the emitter current $i_{E2}$ expressed by the equation (3) never equals zero. This means that the second transistor $Q_2$ is not held at cutoff.

It will be seen that it is possible to have the idea that the value of the denominator of the right side of the equation (3) is constant since each of the values included therein is determined by the respective elements. Therefore, when it is assumed that the value $i_b$ of the current flowing via the driving signal flow-out terminal "b" is constant, the emitter current $i_{E2}$ of the second transistor $Q_2$ is constant accordingly.

The driving signal flow-in terminal "a" is connected to an output of a Class A amplifier (not shown), while the driving signal flow-out terminal "b" is connected to a load such as a resistor or a constant-current circuit. As mentioned supra, the output current of the Class A amplifier is not zero, as well known, when no input signal is supplied thereto. Therefore, when no input signal is fed to the Class A amplifier, which is a prestage of the push-pull arrangement, a predetermined amount of current flows into the driving signal flow-in terminal "a". This current flows via the collector-emitter paths of the transistors $Q_6$ and $Q_7$, base circuits of the third and fourth transistors $Q_3$ and $Q_4$, and the driving signal flow-out terminal "b" toward the load connected to the terminal "b".

It will be understood, therefore, that a decrease in emitter current of the transistor $Q_7$ causes the base current of the third transistor $Q_4$ to increase since the sum of the two currents equals the current $i_b$ flowing via the terminal "b", where the value of $i_b$ is substantially constant.

From a different viewpoint, the circuit arrangement shown in FIG. 4 can be considered as having two closed loops. The first closed loop contains the first resistor $R_1$, the first and third transistors $Q_1$ and $Q_3$, the transistor $Q_6$, and the series circuit of the diode $D_1$ and the resistor $R_6$, while the second closed loop contains the second resistor $R_2$, the second and fourth transistors $Q_2$ and $Q_4$, the transistor $Q_7$, and the series circuit of the diode $D_2$ and the resistor $R_7$. These two closed loops are connected at the junction "f" connecting the first and second resistors $R_1$ and $R_2$ so that currents respectively flowing through resistors $R_6$ and $R_7$ are controlled in accordance with the variation of the current flowing into the drive signal flow-in terminal "a".

Although in the above description of the operation of the circuit arrangement, it is assumed that only the first and second transistors $Q_1$ and $Q_3$ are active for amplifying a positive half cycle of an input signal, it will be understood that the second and fourth transistors $Q_2$ and $Q_4$ are also active at the same time so that a predetermined small amount of collector circuit $I_{C20}$ flows via the collector-emitter path of the second transistor $Q_2$. In other words, the second and fourth transistors $Q_2$ and $Q_4$ are not held at cutoff when the first and third transistors $Q_1$ and $Q_3$ are active to amplify the input signal. It will be further understood that when a negative half cycle of an input signal is applied to the push-pull arrangement, the second and fourth transistors $Q_2$ and $Q_4$ become active to amplify the input signal, while the first and third transistors $Q_1$ and $Q_3$ are also active so that a predetermined collector current $I_{C10}$ flows via the collector-emitter path of the first transistor $Q_1$ in the same manner. The amplification function, upon presence of the negative half cycle, of the single ended push-pull amplifier shown in FIG. 4 will be readily understood accordingly.

Figure 6:
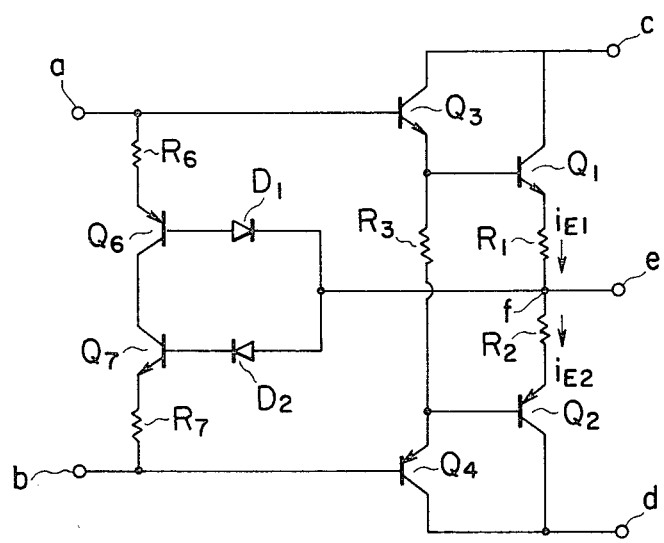
FIG. 6 is a circuit diagram of the second preferred embodiment of the single ended push-pull amplifier according to the present invention.

Reference is now made to FIG. 6, a circuit diagram of the second preferred embodiment of the single ended push-pull amplifier according to the present invention. The circuit arrangements shown in FIGS. 4 and 6 are the same in construction except that the two resistors $R_6$ and $R_7$ respectively connected to the diodes $D_1$ and $D_2$ in the first embodiment are interposed in the emitter circuits of the transistors $Q_6$ and $Q_7$ in the second embodiment.

In the second embodiment therefore, the cathode of the first diode $D_1$ and the anode of the second diode $D_2$ are directly connected to each other and are further connected to the output terminal "e", while the resistor $R_6$ is interposed between the driving signal flow-in terminal "a" and the emitter of the transistor $Q_6$; and the resistor $R_7$ is interposed between the driving signal flow-in terminal "b" and the emitter of the transistor $Q_7$. The circuit shown in FIG. 6 functions in the same manner as the first embodiment shown in FIG. 4 and thus the description of the operation thereof is omitted.

Figure 7:
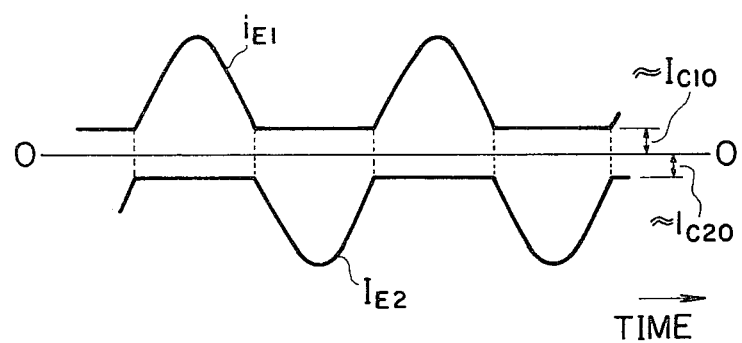
FIG. 7 is a series of waveforms of output signals obtained by two transistors of the final stage of the amplifier shown in either FIG. 4 or FIG. 6.

FIG. 7 is an illustration of the waveform of the output signal obtained by either the first or second embodiment described hereinabove. A curve shown above the zero line indicates the variation of the emitter current $i_{E1}$ of the first transistor $Q_1$, while the other curve shown below the zero line indicates the variation of the emitter current $i_{E2}$ of the second transistor $Q_2$. It will be apparent from the waveform shown in FIG. 7, that constant idling currents $I_{C10}$ and $I_{C20}$ flow respectively via the collector-emitter paths of the first and second transistors $Q_1$ and $Q_2$ irrespective of the presence and absence of the input signal. Therefore, the pair of two groups of transistors $Q_1$ and $Q_3$, and $Q_2$ and $Q_4$ always operate in the active (working) range thereof. In other words, none of the transistors in the final stage is held at cutoff. Consequently, the crossover distortion inherent to the conventional push-pull arrangement is diminished to a considerable extent. Further, undesirable switching distortion is also not produced. It will be understood that all of the problems which are discussed hereinbefore are resolved in the single ended push-pull amplifier according to the present invention. Although in the preferred embodiments described hereinabove, bipolar transistors are used as the active elements, other active elements, such as field effect transistors (FET), may take place of the transistors.

In the single ended push-pull arrangements according to the present invention, since a small amount of idling currents flows via the collector-emitter paths of the transistors of the final stage, the power loss in the form of heat loss is litte higher than in a conventional Class AB single ended push-pull circuit. However, it is to be noted that the degree of the distortion included in the output signal of the Class B single ended push-pull circuit according to the present invention is so small that it is comparable with the degree of the distortion included in the output signal of a Class A push-pull arrangement. (The power loss in Class A operation is about five to ten times larger than that in Class AB operation.)

It will be understood that the above described single ended push-pull circuits are of the preferred embodiments, and therefore, many modifications and variations are possible by those skilled in the art, in the light of the above teachings.

What is claimed is:

1. A single ended push-pull amplifier responsive to a preamplifier of a Class A amplifier so that current flows to the push-pull amplifier from the preamplifier even when no signal is applied to the preamplifier output signal comprising:
   (a) first and second transistor-amplifying stages for respectively amplifying each half cycle of the output signal of the preamplifier, said first and second stages forming a final stage of a single ended push-pull arrangement;
   (b) first and second resistors respectively interposed in the collector-emitter paths of said first and second transistor-amplifying stages;
   (c) a base bias controlling circuit for controlling base bias voltages of said first and second transistor-amplifying stages, said bias controlling circuit including two complementary transistors having series connected collector-emitter paths, the series connected paths of said two transistors being interposed between the base circuits of said first and second transistor amplifying stages; and
   (d) means for controlling said base bias controlling circuit, said means including third and fourth resistors respectively forming first and second closed loops, said first closed loop including a series circuit comprising:
      (a) said first resistor,
      (b) the base circuit of said first transistor-amplifying stage,
      (c) the base-emitter path of one of said two complementary transistors and said third resistor,
   so that the amount of electric current flowing through said third resistor varies in accordance with the current flowing through said first resistor, and all of the current flowing through the base of said transistor included in said first closed loop flows through said third resistor, said second closed loop including a series circuit comprising:
      (a) said second resistor,
      (b) the base circuit of said second transistor-amplifying stage,
      (c) the base-emitter path of the other of said two complementary transistors and said fourth resistor, so that the amount of electric current flowing through said fourth resistor varies in accordance with the current flowing through said second resistor, and all of the current flowing through the base of said transistor included in said second closed loop flows through said fourth resistor, said first closed loop being responsive to said input signal, said second closed loop being connected to a load of said input signal.

2. A single ended push-pull amplifier as claimed in claim 1, wherein each of said first and second transistor-amplifying stages comprises two transistors coupled in Darlington connection.

3. A single ended push-pull amplifier as claimed in claim 1, wherein a series circuit including said third resistor and a diode is interposed between a junction connecting said first and second resistors and the base of said one transistor included in said base bias controlling circuit, and wherein a series circuit including said fourth resistor and a diode is interposed between said junction and the base of said other transistor included in said base bias controlling circuit.

4. A single ended push-pull amplifier as claimed in claim 1, wherein said third resistor is interposed between the base of said first transistor-amplifying stage and the emitter of said one transistor included in said base bias controlling circuit, while said fourth resistor is interposed between the base of said second transistor-amplifying stage and the emitter of said other transistor, and wherein the bases of said two transistors are connected via respective diodes to a junction connecting said first and second resistors.

5. A single ended push-pull amplifier responsive to a preamplifier of a Class A amplifier so that current flows to the push-pull amplifier from the preamplifier even when no signal is applied to the preamplifier output signal comprising:
(a) first, second, third and fourth transistors forming the final stage of a single ended push-pull arrangement, the collectors of said first and third transistors being connected to a positive power supply, the base of said first transistor being connected to the emitter of said third transistor, the base of said third transistor being connected to a driving signal flow-in terminal responsive to the output signal of the preamplifier, the collectors of said second and fourth transistors being connected to a negative power supply, the base of said second transistor being connected to the emitter of said fourth transistor, the base of said fourth transistor being connected to a driving signal flow-out terminal to which a load of said preamplifier output signal is connected,
(b) first and second resistors connected in series and interposed between the emitters of said first and second transistors, a junction connecting said first and second resistors being connected to an output terminal;
(c) fifth and sixth transistors for controlling base voltages of said third and fourth transistors, the emitters of said fifth and sixth transistors being respectively connected to the bases of said third and fourth transistors, the collectors of said fifth and sixth transistors being connected to each other;
(d) third and fourth resistors respectively connected in series between the base circuits of said fifth and sixth transistors and said output terminal.

6. A single ended push-pull amplifier responsive to a preamplifier of a Class A amplifier so that current flows to the push-pull amplifier from the preamplifier even when no signal is applied to the preamplifier output signal comprising:
(a) first, second, third and fourth transistors forming the final stage of a single ended push-pull arrangement, the collectors of said first and third transistors being connected to a positive power supply, the base of said first transistor being connected to the emitter of said third transistor, the base of said third transistor being connected to a driving signal flow-in terminal responsive to the output signal of the preamplifier, the collectors of said second and fourth transistors being connected to a negative power supply, the base of said second transistor being connected to the emitter of said fourth transistor, the base of said fourth transistor being connected to a driving signal flow-out terminal to which a load of said preamplifier output is connected;
(b) first and second resistors connected in series and interposed between the emitters of said first and second transistors, a junction connecting said first and second resistors being connected to an output terminal;
(c) fifth and sixth transistors for controlling base voltages of said third and fourth transistors, the bases of said fifth and sixth transistors being connected to said output terminal, the collectors of said fifth and sixth transistors being connected to each other;
(d) third and fourth resistors respectively connected in series between the emitters of said fifth and sixth transistors and the bases of said third and fourth transistors.

7. A single ended push-pull amplifier as claimed in claim 5 or 6, further comprising a resistor connected in series between the emitters of said third and fourth transistors.

8. A single ended push-pull amplifier as claimed in claim 5 or 6, further comprising two diodes respectively connected in a series circuit between the base circuits of said fifth and sixth transistors and said output terminal.

* * * * *